United States Patent
Lin et al.

(10) Patent No.: US 11,205,381 B2
(45) Date of Patent: Dec. 21, 2021

(54) DISPLAY PANEL, DISPLAY DEVICE AND COMPENSATION METHOD

(71) Applicant: BOE Technology Group Co., Ltd., Beijing (CN)

(72) Inventors: Yi Cheng Lin, Beijing (CN); Quanhu Li, Beijing (CN); Cuili Gai, Beijing (CN); Ling Wang, Beijing (CN); Baoxia Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 378 days.

(21) Appl. No.: 15/748,731

(22) PCT Filed: Jun. 30, 2017

(86) PCT No.: PCT/CN2017/091190
§ 371 (c)(1),
(2) Date: Jan. 30, 2018

(87) PCT Pub. No.: WO2018/099073
PCT Pub. Date: Jun. 7, 2018

(65) Prior Publication Data
US 2020/0082756 A1 Mar. 12, 2020

(30) Foreign Application Priority Data
Dec. 1, 2016 (CN) .......................... 201611090721.1

(51) Int. Cl.
*G09G 3/3258* (2016.01)
*H01L 27/32* (2006.01)

(52) U.S. Cl.
CPC ....... *G09G 3/3258* (2013.01); *H01L 27/3276* (2013.01); *G09G 2300/0439* (2013.01); *G09G 2320/0252* (2013.01)

(58) Field of Classification Search
CPC ......... G09G 3/3258; G09G 2300/0439; G09G 2320/0252; G09G 3/3225; H01L 27/3276; H01L 27/32; H01L 27/3248; H01L 27/326
See application file for complete search history.

(56) References Cited

U.S. PATENT DOCUMENTS

| 8,018,420 B2 * | 9/2011 | Lee ...................... G09G 3/3648 345/100 |
| 9,841,642 B2 * | 12/2017 | Tanaka .............. G02F 1/133512 |

(Continued)

FOREIGN PATENT DOCUMENTS

| CN | 103578424 A | 2/2014 |
| CN | 104465715 A | 3/2015 |

(Continued)

OTHER PUBLICATIONS

Oct. 1, 2017—(WO) International Search Report and Written Opinion Appn PCT/CN2017/091190.

*Primary Examiner* — Jose R Soto Lopez
(74) *Attorney, Agent, or Firm* — Banner & Witcoff, Ltd.

(57) ABSTRACT

A display panel, a display device and a compensation method are provided. The display panel includes at least one pixel unit group, at least one sensing line, a plurality of gate lines, a plurality of first data lines and a plurality of second data lines. Each pixel unit group includes a plurality of pixel units arranged in two rows and a plurality of columns, the plurality of pixel units in each pixel unit group are connected to a same one of the gate lines, one of two pixel units in each column of each pixel unit group is connected to one of the first data lines corresponding thereto, other one is connected to one of the second data lines corresponding thereto, the plurality of pixel units in each pixel unit group are connected to a same sensing line.

18 Claims, 4 Drawing Sheets

(56) References Cited

U.S. PATENT DOCUMENTS

| | | | | |
|---|---|---|---|---|
| 10,013,938 B2* | 7/2018 | Xi | | G02F 1/133 |
| 10,067,395 B2* | 9/2018 | Lin | | G02F 1/136286 |
| 10,133,138 B2* | 11/2018 | Oh | | G02F 1/134336 |
| 2009/0027325 A1* | 1/2009 | Kim | | G09G 3/3696 |
| | | | | 345/92 |
| 2012/0293478 A1* | 11/2012 | Chaji | | G09G 3/3266 |
| | | | | 345/212 |
| 2014/0035965 A1* | 2/2014 | Toyomura | | G09G 3/3233 |
| | | | | 345/690 |
| 2014/0266995 A1* | 9/2014 | Cho | | G09G 3/2077 |
| | | | | 345/88 |
| 2015/0302808 A1* | 10/2015 | Wang | | G02F 1/136286 |
| | | | | 345/691 |
| 2015/0309360 A1* | 10/2015 | Wang | | G02F 1/134336 |
| | | | | 345/694 |
| 2015/0325197 A1* | 11/2015 | Hong | | G09G 3/3688 |
| | | | | 345/205 |
| 2016/0012798 A1* | 1/2016 | Oh | | G09G 3/325 |
| | | | | 345/205 |
| 2016/0133193 A1* | 5/2016 | Lee | | G09G 3/3275 |
| | | | | 345/694 |
| 2016/0155777 A1* | 6/2016 | Kabe | | G09G 3/32 |
| | | | | 257/89 |
| 2016/0189606 A1* | 6/2016 | Chen | | G09G 3/3659 |
| | | | | 345/214 |
| 2016/0320878 A1* | 11/2016 | Hong | | G06F 1/1652 |
| 2016/0351093 A1* | 12/2016 | Kim | | G09G 3/2092 |
| 2017/0038898 A1* | 2/2017 | Kim | | G09G 3/3233 |
| 2017/0039928 A1* | 2/2017 | Zhang | | G09G 3/3266 |
| 2017/0046006 A1* | 2/2017 | Kim | | G09G 3/3266 |
| 2017/0075447 A1* | 3/2017 | Zuo | | G09G 3/20 |
| 2017/0132977 A1* | 5/2017 | Kim | | G09G 3/3266 |
| 2017/0132979 A1* | 5/2017 | Oh | | G09G 3/3233 |
| 2017/0140706 A1* | 5/2017 | Song | | G09G 3/3233 |
| 2017/0256198 A1* | 9/2017 | Hwang | | G09G 3/3266 |
| 2017/0270868 A1* | 9/2017 | Li | | G09G 3/3266 |
| 2017/0294159 A1* | 10/2017 | Lee | | H01L 27/3248 |
| 2018/0013085 A1* | 1/2018 | Shin | | G09G 3/3291 |
| 2018/0033366 A1* | 2/2018 | Yoo | | G09G 3/3233 |
| 2018/0033383 A1* | 2/2018 | Kim | | G09G 3/3607 |
| 2018/0061913 A1* | 3/2018 | Kim | | H01L 27/3244 |
| 2018/0130423 A1* | 5/2018 | Kim | | H01L 27/3262 |
| 2018/0190733 A1* | 7/2018 | Hsu | | H01L 27/3218 |
| 2019/0073938 A1* | 3/2019 | Shi | | H01L 27/3213 |

FOREIGN PATENT DOCUMENTS

| | | |
|---|---|---|
| CN | 105243996 A | 1/2016 |
| CN | 105633122 A | 6/2016 |
| CN | 106531767 A | 3/2017 |

* cited by examiner

DISPLAY PANEL, DISPLAY DEVICE AND COMPENSATION METHOD

The application is a U.S. National Phase Entry of International Application No. PCT/CN2017/091190 filed on Jun. 30, 2017, designating the United States of America and claiming priority to Chinese Patent Application No. 201611090721.1, filed Dec. 1, 2016. The present application claims priority to and the benefit of the above-identified applications and the above-identified applications are incorporated by reference herein in their entirety.

TECHNICAL FIELD

Embodiments of the present disclosure relate to a display panel, a display device and a compensation method.

BACKGROUND

In a display field, an organic light-emitting diode (OLED) display panel has characteristics of self-luminous, high contrast, low energy consumption, wide viewing angle, fast response, ability to be used for a flexible panel, wide temperature range, simple manufacture and so on, and has a broad prospect for development.

Due to the above characteristics, an organic light-emitting diode (OLED) display panel can be applied to a mobile phone, a monitor, a notebook computer, a digital camera, or any devices having a display function.

SUMMARY

At least one embodiment of the present disclosure provides a display panel, comprising at least one pixel unit group, at least one sensing line, a plurality of gate lines, a plurality of first data lines and a plurality of second data lines. Each pixel unit group comprises a plurality of pixel units arranged in two rows and a plurality of columns, the plurality of pixel units in each pixel unit group are connected to a same one of the gate lines to receive a same gate signal, one of two pixel units in each column of each pixel unit group is connected to one of the first data lines corresponding thereto, other one of the two pixel units in each column of each pixel unit group is connected to one of the second data lines corresponding thereto, the plurality of pixel units in each pixel unit group are connected to a same sensing line, each of the plurality of pixel units comprises a light-emitting element, and the sensing line is configured to sense a light-emitting current or a light-emitting voltage of the light-emitting element.

For example, in the display panel provided by an embodiment of the present disclosure, each of the pixel units further comprises: a drive circuit and a sensing control circuit. The drive circuit is configured to drive the light-emitting element to emit light during operation; and the sensing control circuit is configured to control the sensing line to sense the light-emitting current or the light-emitting voltage of the light-emitting element.

For example, in the display panel provided by an embodiment of the present disclosure, the drive circuit comprises a first transistor, a second transistor and a storage capacitor, a first electrode of the first transistor is connected to a first power line to receive a first power voltage, a gate electrode of the first transistor is connected to a first node, a second electrode of the first transistor is connected to a second node; a first electrode of the second transistor is configured to receive a data signal, a gate electrode of the second transistor is connected to one of the plurality of gate lines to receive a gate drive signal, a second electrode of the second transistor is connected to the first node; and a first end of the storage capacitor is connected to the first node, and a second end of the storage capacitor is connected to the second node.

For example, the display panel provided by an embodiment of the present disclosure further comprises a plurality of sensing control lines, the sensing control circuit comprises a third transistor, a first electrode of the third transistor is connected to the second node, a gate electrode of the third transistor is connected to one of the plurality of sensing control lines to receive a sensing control signal, and a second electrode of the third transistor is connected to the sensing line.

For example, the display panel provided by an embodiment of the present disclosure further comprises a first power line, and the first power line is configured to provide a first power voltage to the plurality of pixel units.

For example, the display panel provided by an embodiment of the present disclosure further comprises a data driver, a scan driver and a compensation controller, the data driver is configured to provide a data signal to the pixel unit; the scan driver is configured to provide a gate drive signal to the pixel unit; and the compensation controller is configured to generate compensation data according to the light-emitting current or the light-emitting voltage of the light-emitting element sensed by the sensing line and compensate the data signal with the compensation data.

For example, in the display panel provided by an embodiment of the present disclosure, each pixel unit group comprises the pixel units in two rows and two columns, the pixel units in two rows and three columns, or the pixel units in two rows and four columns For example, in the display panel provided by an embodiment of the present disclosure, the sensing line, the first data lines and the second data lines extend in a same direction.

For example, in the display panel provided by an embodiment of the present disclosure, the sensing line is formed in a same layer as the first data lines and/or the second data lines.

For example, in the display panel provided by an embodiment of the present disclosure, the first data lines and the second data lines adjacent thereto are disposed between the pixel units in adjacent two columns For example, in the display panel provided by an embodiment of the present disclosure, the sensing line is disposed between one of the first data lines and one of the second data lines adjacent thereto.

For example, the display panel provided by an embodiment of the present disclosure comprises a plurality of pixel unit groups, the plurality of pixel unit groups are arranged in a matrix, and the pixel units of the plurality of pixel unit groups in each column are connected to a same sensing line.

For example, in the display panel provided by an embodiment of the present disclosure, each of the pixel units in a first row of each of the plurality of pixel unit groups is connected to one of the first data lines corresponding thereto, and each of the pixel units in a second row of each of the plurality of pixel unit groups is connected to one of the second data lines corresponding thereto.

For example, in the display panel provided by an embodiment of the present disclosure, the pixel units in each of the plurality of pixel unit groups are connected to the same sensing line through connection lines, in each of the plurality of pixel unit groups, a connection line connected to a first row of the pixel units is located at a side of the first row of the pixel units away from a second row of the pixel units, and a connection line connected to the second row of the pixel units is located at a side of the second row of the pixel units away from the first row of the pixel units.

An embodiment of the present disclosure further provides a display device, comprising a display panel provided by any one embodiment of the present disclosure.

An embodiment of the present disclosure further provides a compensation method for a display panel provided by any one embodiment of the present disclosure, comprising: at different periods of a gate line being selected, sensing light-emitting currents or light-emitting voltages of light-emitting elements in the pixel unit group corresponding to the gate line respectively by using the sensing line.

For example, the compensation method provided by an embodiment of the present disclosure further comprises: generating compensation data according to the light-emitting currents or the light-emitting voltages of the plurality of light-emitting elements in the pixel unit group sensed by the sensing line, and respectively compensating data signals applied to the pixel units in the pixel unit group by using the compensation data.

For example, a display panel, a display device and a compensation method provided by at least one embodiment of the present disclosure can increase the aperture ratio of a pixel unit through double-line scanning and sharing a sensing line, provide more sufficient charging time for the pixel unit and accelerate a sensing speed.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

The technical solutions of the embodiments of the present disclosure will be described in a clearly and fully understandable way below in connection with the accompanying drawings, referring to the non-limiting exemplary embodiments illustrated in the accompanying drawings and detailed in the following description, the exemplary embodiments of the present disclosure and their various features and advantageous details are more fully described. It should be noted that, the features shown in figures are not necessarily to be drawn in a real scale. The description of the known material(s), component(s) and process technology can be omitted in the present disclosure, so that the exemplary embodiments of the present disclosure are not obscured. The examples provided are merely intended to be beneficial for understanding the implementation of the exemplary embodiments of the present disclosure, and further enable one of ordinary skill in the art to which the present disclosure belongs to implement the exemplary embodiments. Therefore, the examples should not be construed as a limitation of the scope of the embodiments of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. In addition, in respective embodiments of the present disclosure, the same or similar reference numerals denote the same or similar components.

An organic light-emitting diode (OLED) display panel may be driven by a progressive scanning method, this drive method can increase a refresh frequency, but may cause that the charging time of the pixel unit is insufficient so as to lead to poor picture quality and is not helpful for the development of a large-size and high-resolution OLED display product.

An OLED display panel also may be driven by a double-line scanning method, that is, at any time, two rows of the pixel units are in a charging state, and twice of the charging time of the progressive scanning method can be provided for each pixel unit so as to ensure picture quality, especially for a large-size and high-resolution OLED display product.

On the other hand, in an OLED display panel, threshold voltages of drive transistors in respective pixel units may be different from each other due to the manufacturing process, and the threshold voltages of the drive transistors may drift due to an influence of, for example, a temperature fluctuation. Therefore, the difference among the threshold voltages of respective drive transistors may also cause the display panel to display unevenly. Hence, the threshold voltages of the drive transistors need to be compensated.

A pixel unit in a display panel provided by at least one embodiment of the present disclosure can achieve threshold compensation of a drive transistor in the pixel unit through sensing a light-emitting current or a light-emitting voltage of a light-emitting element. In a case that the above compensation method is adopted, a sensing line needs to be disposed, parasitic capacitance occurs generated between the sensing line and other lines (such as a gate line), so as to increase the RC load of a circuit, reduce a sensing speed and easily lead to lack of sensing time.

A display panel, a display device and a compensation method provided by at least one embodiment of the present disclosure can increase the aperture ratio of a pixel unit through double-line scanning and sharing a sensing line, and can also provide more sufficient charging time for the pixel unit and accelerate the sensing speed.

For example, the display panel, the display device and the compensation method provided by at least one embodiment of the present disclosure can increase the aperture ratio of a pixel unit to over 50%, double the charging time and reduce the parasitic capacitance by 30%.

At least one embodiment of the present disclosure provides a display panel, comprising at least one pixel unit group, at least one sensing line, a plurality of gate lines, a plurality of first data lines and a plurality of second data lines. Each pixel unit group comprises a plurality of pixel units arranged in two rows and a plurality of columns, pixel units in each pixel unit group are connected to a same gate line to receive a same gate signal, one of two pixel units in each column of each pixel unit group is connected to a first data line corresponding thereto, other one of the two pixel units in each column of each pixel unit group is connected to a second data line corresponding thereto, the pixel units in each pixel unit group are connected to a same sensing line, each of the pixel units comprises a light-emitting element, and the sensing line is configured to sense a light-emitting current or a light-emitting voltage of the light-emitting element.

Figure 1:
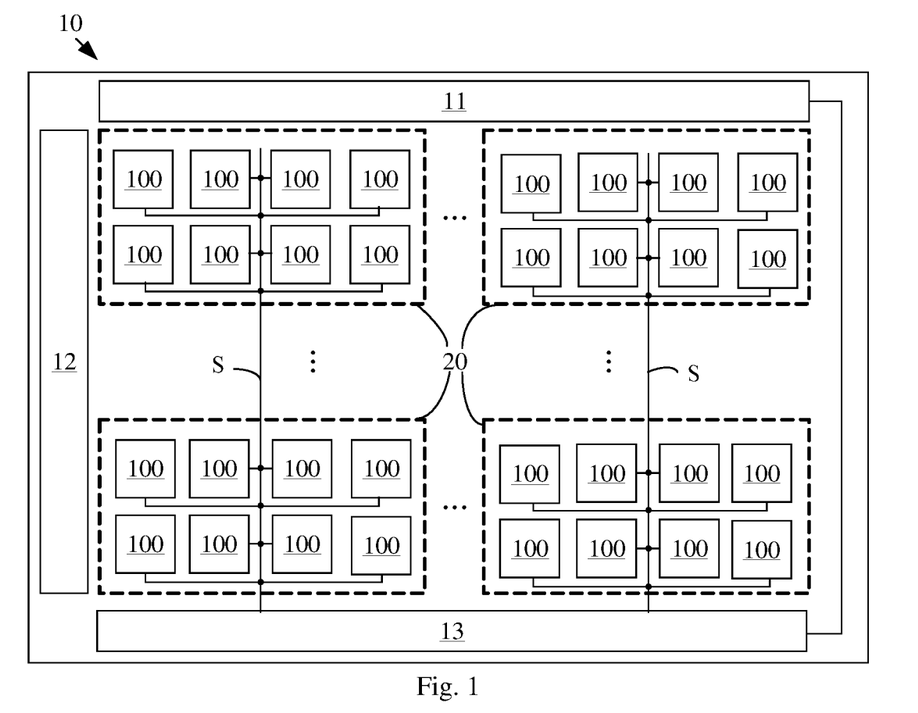
FIG. 1 is a schematic diagram of a display panel provided by an embodiment of the present disclosure.

An embodiment of the present disclosure provides a display panel 10, as shown in FIG. 1, in an example, the display panel 10 comprises a plurality of pixel unit groups 20, and each pixel unit group 20 comprises a plurality of (eight as an example in FIG. 1) pixel units 100 arranged in two row and a plurality of columns (four columns as an example in FIG. 1).

For example, a pixel unit 100 comprises a light-emitting element, the light-emitting element may be an organic light-emitting element, such as an organic light-emitting diode OLED and the like. In the embodiment of the present disclosure, the light-emitting element is the organic light-emitting diode OLED, which is taken as an example for description simplicity.

For example, as shown in FIG. 1, the display panel 10 comprises a plurality of sensing lines S, the plurality of pixel unit groups 20 is arranged in a matrix, and the pixel units 100 in each column of pixel unit groups 20 are connected to a same sensing line S, so that the number of the sensing lines S in the display panel 10 can be reduced, parasitic capacitance between the sensing lines S and other lines (such as a gate line) can be reduced, furthermore a sensing speed is accelerated and sensing time is increased.

For example, as shown in FIG. 1, the display panel 100 provided by an embodiment of the present disclosure further comprises a data driver 11, a scan driver 12 and a compensation controller 13. The data driver 11 is configured to provide a data signal to the pixel unit 100; the scan driver 12 is configured to provide a gate drive signal to the pixel unit 100; and the compensation controller 13 is configured to generate compensation data according to the light-emitting current or the light-emitting voltage of the organic light-emitting diode in the pixel unit 100 sensed by the sensing line S and compensate the data signal according to the compensation data.

For example, the data driver 11, the scan driver 12 and the compensation controller 13 may be implemented respectively by specific integrated circuit chips; alternatively, the scan driver 12 may be implemented by a gate driver circuit chip, and the data driver 11 and the compensation controller 13 may be implemented by a same integrated chip.

For example, the display panel 10 may further comprise a controller (not shown in figures), the controller is signal-coupled to the data driver 11, the scan driver 12 and the compensation controller 13, and is configured to provide control instructions and/or timing signals to the data driver 11, the scan driver 12 and the compensation controller 13, so that the data driver 11, the scan driver 12 and the compensation controller 13 can work cooperatively.

For example, the data driver 11 and the compensation controller 13 may be connected together, so that the compensation controller 13 can obtain an original data signal before compensating from the data driver 11 and send an updated data signal after compensating to the data driver 11.

Figure 2:
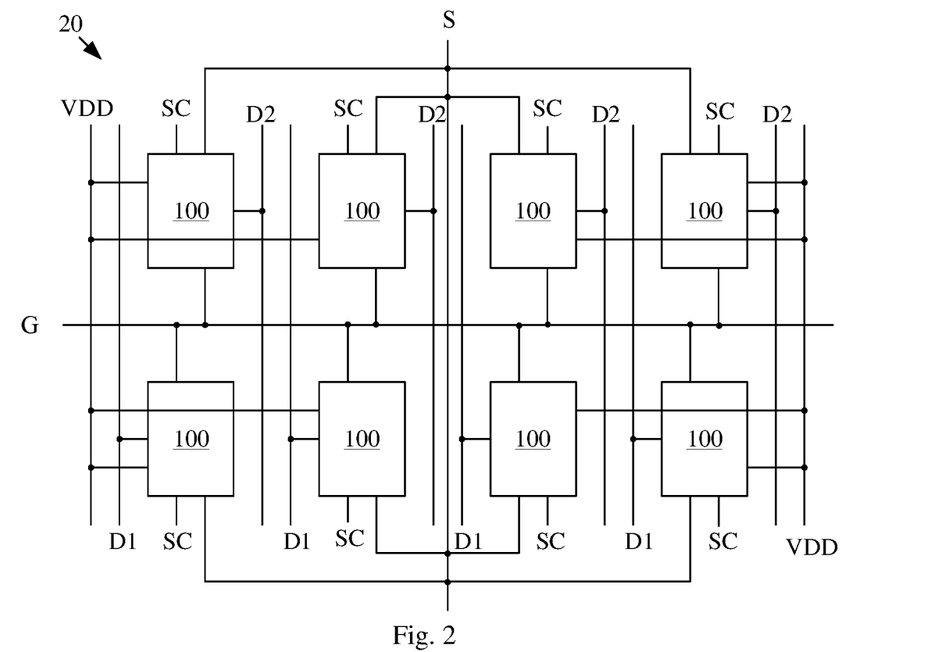
FIG. 2 is a first schematic diagram of a pixel unit group in a display panel provided by an embodiment of the present disclosure.
Figure 3:
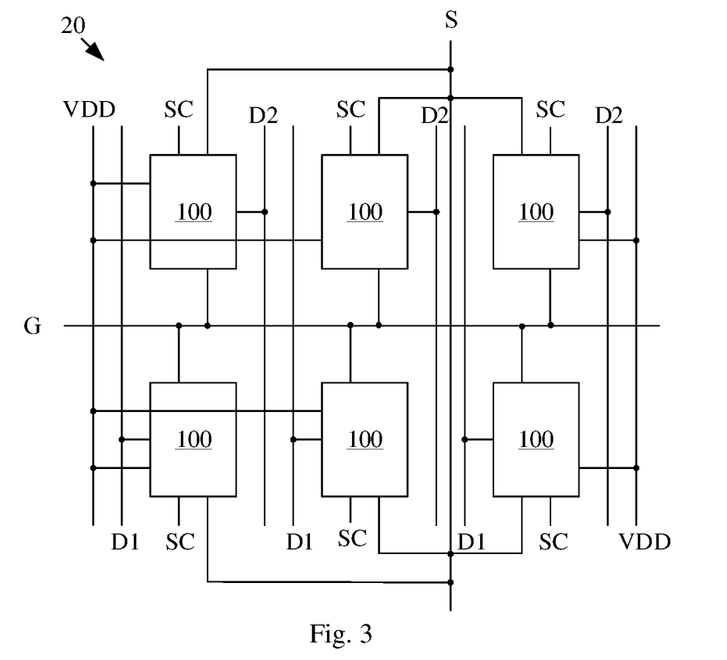
FIG. 3 is a second schematic diagram of a pixel unit group in a display panel provided by an embodiment of the present disclosure.

For example, FIG. 2 or FIG. 3 shows a pixel unit group 20 in the display panel 10. The pixel unit group 20 shown in FIG. 2 comprises the pixel units 100 in two rows and four columns; and the pixel unit group 20 shown in FIG. 3 comprises the pixel units 100 in two rows and three columns.

It is to be noted that, the embodiment of the present disclosure includes, but is not limited to, the pixel unit group as shown in FIG. 2 or FIG. 3. The pixel unit group may also comprise other numbers of pixel units, for example, each pixel unit group 20 may further comprise the pixel units 100 in two rows and two columns and the pixel units 100 in two rows and five columns The embodiment of the present disclosure does not impose limitations thereto.

For example, as shown in FIG. 2 or FIG. 3, the display panel 10 comprises a plurality sensing lines S, a plurality of sensing control lines SC, a plurality of gate lines G, a plurality of first data lines D1 and a plurality of second data lines D2.

For example, the sensing line S is connected to the compensation controller 13 to transmit the light-emitting voltage or light-emitting current of the sensed organic light-emitting diode to the compensation controller 13.

For example, the gate line G is connected to the scan driver 12 and receives the gate drive signal provided by the scan driver 12.

For example, the first data line D1 and the second data line D2 are connected to the data driver 11, and receive the data signals provided by the data driver 11.

For example, the sensing control line SC may be connected to the scan driver 12 and receive a sensing control signal provided by the scan driver 12.

Figure 5:
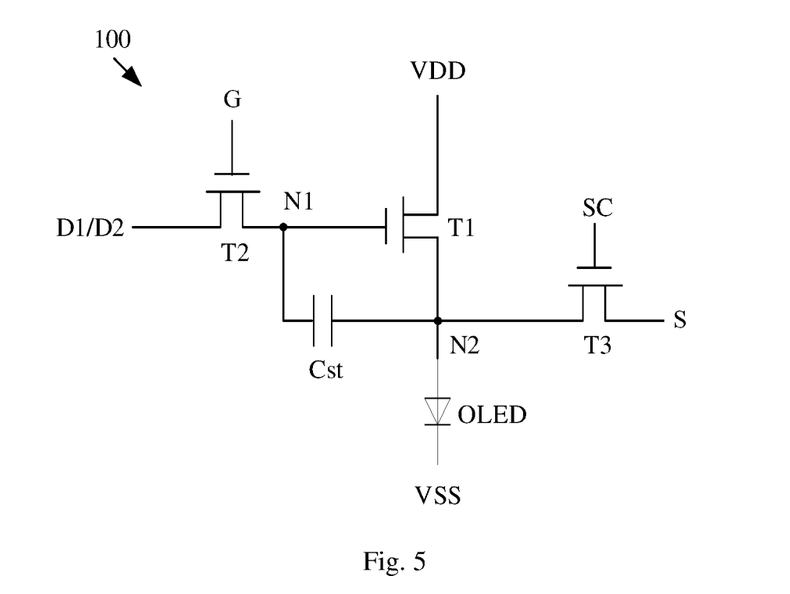
FIG. 5 is a second schematic diagram of a pixel unit in a display panel provided by an embodiment of the present disclosure.

For example, as shown in FIG. 2, FIG. 3 and FIG. 5, all the pixel units 100 in each pixel unit group 20 may be connected to one gate line G to receive a same gate signal, so that second transistors T2 in all the pixel units 100 in each pixel unit group 20 can be turned on or off at the same time. For example, the gate line G may be disposed between two rows of the pixel units 100 in each pixel unit group 20.

For example, one of two pixel units 100 in each column of each pixel unit group 20 is connected to a first data line D1 corresponding thereto; the other one of the two pixel units 100 in each column of each pixel unit group 20 is connected to a second data line D2 corresponding thereto. For example, referring to FIG. 2 or FIG. 3, a first row pixel unit in each column of the pixel units 100 is connected to a first data line D1 corresponding thereto, and a second row pixel unit in each column of the pixel units 100 is connected to a second data line D2 corresponding thereto.

For example, as shown in FIG. 2 and FIG. 3, each of the pixel units 100 in a first row of each pixel unit group 20 is connected to a first data line D1 corresponding thereto, and each of the pixel units 100 in a second row of each pixel unit group 20 is connected to a second data line D2 corresponding thereto. For example, the first data line D1 may be located on the left side of the pixel unit 100 connected thereto, and the second data line D2 may be located on the right side of the pixel unit 100 connected thereto. However the present disclosure is not limited thereto, the first data line D1 may also be located on the right side of the pixel unit 100 connected thereto, and the second data line D2 may be located on the left side of the pixel unit 100 connected thereto.

For example, all the pixel units 100 in each pixel unit group 20 may be connected to a same sensing line S. Each of the pixel units 100 may be respectively connected to a corresponding sensing control lines SC, so that under the control of the sensing control lines SC, the light-emitting currents or the light-emitting voltages of the organic light-emitting diodes in all the pixel units 100 in each pixel unit group 20 can be time-divisionally sensed by the same sensing line S.

For example, each pixel unit 100 in each pixel unit group 20 is connected to the same sensing line S through a connection line. In each pixel unit group 20, the connection lines connected to the first row pixel units 100 are located at a side of the first row pixel units 100 away from the second row pixel units 100, and the connection lines connected to the second row pixel units 100 are located at a side of the second row pixel units 100 away from the first row pixel units 100.

For example, in the display panel 10 provided by an embodiment of the present disclosure, the sensing line S, and the first data line D1 and the second data line D2 may extend in a same direction.

For example, the first data line D1 and the second data line D2 adjacent to the first data line are disposed between the pixel units 100 in adjacent two columns.

For example, the embodiments of the present disclosure comprise, but are not limited to, the case that the sensing line S, the first data line D1 and the second data line D2 extend in the same direction, the direction in which the sensing line S extends may be the same as the direction in which the gate line G extends. For example, in a case that the sensing line S, the first data line D1 and the second data line D2 extend in the same direction, an integrated circuit chips for implementing the data driver 11 and an integrated circuit chip for implementing the compensation controller 13 may be disposed together or they can be implemented by a same chip.

For example, in the display panel 10 provided by an embodiment of the present disclosure, the sensing line S may be formed in a same layer as the first data line D1 and/or the second data line D2. For example, the sensing line S is formed in the same layer as the first data line D1 and/or the second data line D2, which can simplify a manufacturing process of the display panel and facilitate wiring.

For example, the sensing line S is disposed between the first data line D1 and the second data line D2 adjacent thereto.

For example, as shown in FIG. 2 and FIG. 3, the display panel 10 provided by an embodiment of the present disclosure further comprises first power lines VDD. The first power lines VDD are configured to provide a first power voltage to the plurality of pixel units 100.

For example, the display panel 10 further comprises second power lines VSS (not shown in figures). The second power lines VSS are configured to provide a second power voltage to the plurality of pixel units 100. For example, a second power line VSS may be connected to a cathode of the organic light-emitting diode OLED.

For example, the first power voltage may be a high level voltage (such as, 5 V); the second power voltage may be a low level voltage (such as, 0V). However the present disclosure is not limited thereto, the first power voltage also may be the low level voltage, and the second power voltage may be the high level voltage.

Figure 4:
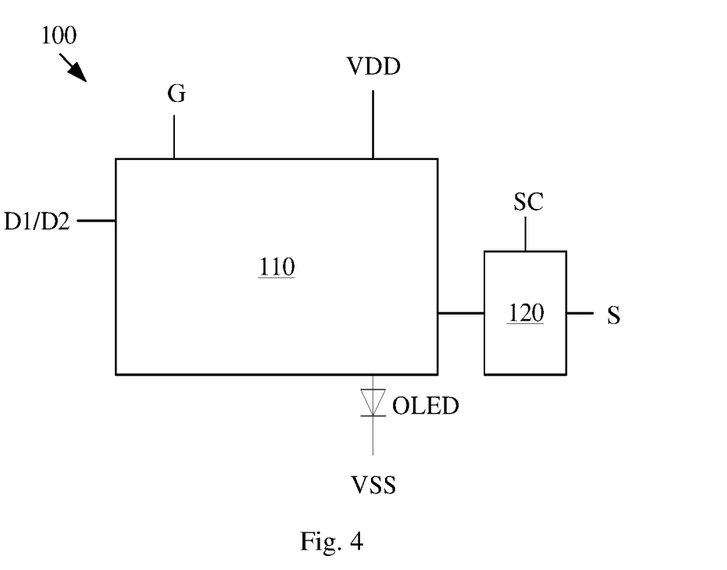
FIG. 4 is a first schematic diagram of a pixel unit in a display panel provided by an embodiment of the present disclosure.

For example, as shown in FIG. 4, in an example, the pixel unit 100 comprises the organic light-emitting diode OLED, the sensing line is used to sense the light-emitting current or the light-emitting voltage of the organic light-emitting diode OLED during operation.

For example, as shown in FIG. 4, in the display panel 10 provided by an embodiment of the present disclosure, the pixel unit 100 further comprises a drive circuit 110 and a sensing control circuit 120. The drive circuit 110 is configured to drive the organic light-emitting diode OLED to emit light during operation; and the sensing control circuit 120 is configured to control the sensing line S to sense the light-emitting current or the light-emitting voltage of the organic light-emitting diode OLED.

For example, as shown in FIG. 5, in the display panel 10 provided by an embodiment of the present disclosure, the drive circuit 110 comprises a first transistor T1, a second transistor T2 and a storage capacitor Cst. A first electrode of the first transistor T1 is connected to the first power line VDD to receive the first power voltage, a gate electrode of the first transistor T1 is connected to a first node N1, and a second electrode of the first transistor T1 is connected to a second node N2. A first electrode of the second transistor T2 is configured to receive the data signal (for example, the data signal transmitted by the first data line D1 or the second data line D2 corresponding to the pixel unit), a gate electrode of the second transistor T2 is connected to the gate line G to receive the gate drive signal, and a second electrode of the second transistor T2 is connected to the first node N1. The second transistor T2 is configured to transmit the data signal to the first node N1 in a case of being turned on. A first end of the storage capacitor Cst is connected to the first node N1, and a second end of the storage capacitor Cst is connected to the second node N2. The storage capacitor Cst is configured to store the data signal and keep the data signal in the first node N1.

For example, as shown in FIG. 5, in the display panel 10 provided by an embodiment of the present disclosure, the sensing control circuit 120 comprises a third transistor T3. A first electrode of the third transistor T3 is connected to the second node N2, a gate electrode of the third transistor T3 is connected to the sensing control line SC to receive the sensing control signal, and a second electrode of the third transistor T3 is connected to the sensing line S.

For example, an anode of the organic light-emitting diode OLED is connected to the second node N2, and the cathode of the organic light-emitting diode OLED is connected to the second power line VSS to receive the second power voltage.

It is to be noted that, transistors used in the embodiment of the present disclosure may be thin film transistors, field effect transistors or other switching devices with the like characteristics. A source electrode and a drain electrode of the transistor used herein may be symmetrical in structure, so the source electrode and the drain electrode of the transistor may have no difference in structure. In the embodiments of the present disclosure, in order to distinguish two electrodes of the transistor apart from a gate electrode, one of the two electrodes is directly referred to as a first electrode, and the other of the two electrodes is referred to as a second electrode, and therefore the first electrode and the second electrode of all or part of the transistors in the embodiments of the present disclosure are interchangeable as required. For example, the first electrode of the transistor described in the embodiment of the present may be the source electrode, and the second electrode may be the drain electrode; alternatively, the first electrode of the transistor may be the drain electrode, and the second electrode may be the source electrode. In addition, the transistors may be classified into N-type transistors and P-type transistors according to the characteristics of the transistors. The embodiments of the present disclosure do not limit the type of the transistors, and one of ordinary skill in the art can implement the embodiments of the present disclosure by using N-type and/or P-type transistors according to actual needs.

It is to be noted that, the embodiments of the present disclosure comprises, but is not limited to, the pixel units shown in FIG. 4 or FIG. 5, and also may be the pixel units having other structure(s). For example, the sensing control circuit 120 is not limited to connect to a position of the second node N2, and also may be connected to other positions where the light-emitting current or the light-emitting voltage of the organic light-emitting diode OLED can be sensed. For another example, the pixel unit may further include other circuits, such as a reset circuit for resetting the gate electrode of the first transistor, a light-emitting control circuit for controlling the organic light-emitting diode OLED to emit light, and the like.

For example, a pixel unit group is taken as an example to describe a working process of the display panel below. For example, in a light-emitting stage of the organic light-emitting diode OLED, the third transistors T3 in each pixel unit 100 in the pixel unit group 20 are controlled to be turned on sequentially by the sensing control lines SC respectively, so as to respectively sense the light-emitting currents or the light-emitting voltages of a plurality of organic light-emitting diodes OLED in the pixel unit group 20 by one sensing line S. For example, the light-emitting voltage sensed by the sensing line S is V1, and a preset light-emitting voltage of the pixel unit 100 is V0, then the compensation data is VC=V1−V0. For example, the light-emitting current sensed by the sensing line S is I1, and a preset light-emitting current of the pixel unit 100 is I0, then a compensation current is IC=I1−I0. The compensation data VC is a compensation voltage corresponding to the compensation current IC, a relationship between the compensation data VC and the compensation current IC maybe a functional relationship or a correspondence table established through experiments, so that from the functional relationship or the correspondence table, the compensation data VC can be restored based on the compensation current IC. For example, the updated data signal Vdata may be obtained by subtracting the compensation data VC from the initial data signal Vdata0 applied to the pixel unit 100, namely the updated data signal Vdata=Vdata0−VC. For example, after the updated data signal Vdata is obtained, the data driver 11 can provide the updated data signal Vdata to the pixel unit 100 corresponding to the updated data signal Vdata through the first data line D1 or the second data line D2. In this way, the threshold voltage compensation and the channel mobility compensation of the first transistor T1 in the pixel unit 100 can be implemented, so as to improve the display accuracy.

Figure 6:
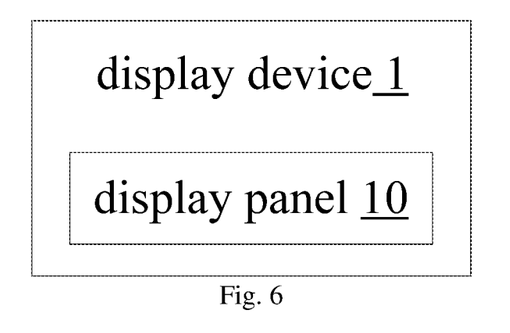
FIG. 6 is a schematic diagram of a display device provided by an embodiment of the present disclosure.

An embodiment of the present disclosure further provides a display device 1, as shown in FIG. 6, the display device 1 comprises a display panel 10 provided by any one embodiment of the present disclosure.

The display device 1 provided by an embodiment of the present disclosure can be a mobile phone, a tablet, a television, a monitor, a notebook computer, a digital photo frame, a navigator, or any products or components having a display function.

Figure 7:
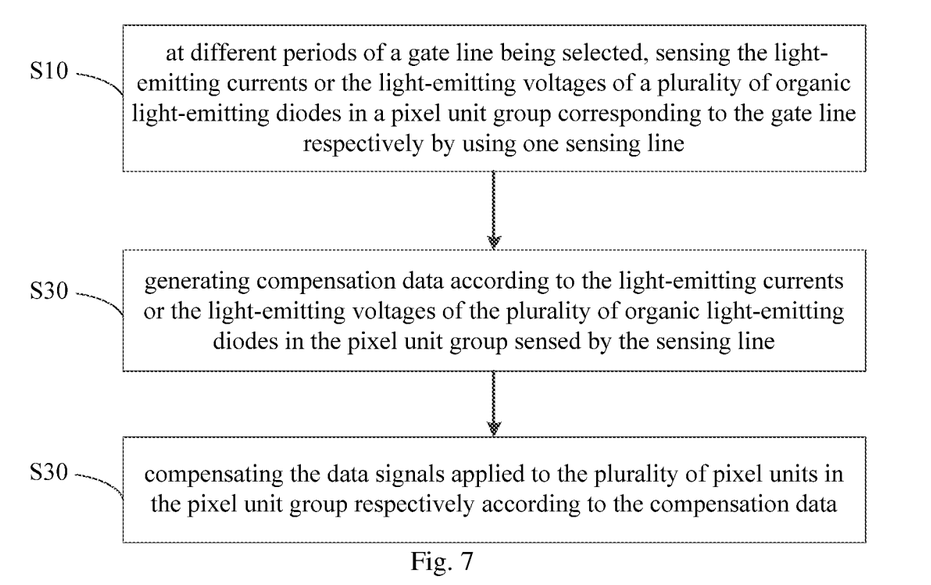
FIG. 7 is a flow chart of a compensation method provided by an embodiment of the present disclosure.

An embodiment of the present disclosure further provides a compensation method for a display panel provided by any one embodiment of the present disclosure, as shown in FIG. 7, an example of the compensation method may comprise the following operations:

S10: at different periods of a gate line being selected, sensing the light-emitting currents or the light-emitting voltages of a plurality of organic light-emitting diodes in a pixel unit group corresponding to the gate line respectively by using one sensing line.

For example, the compensation method provided by an embodiment of the present disclosure further comprises the following operations:

S20: generating compensation data according to the light-emitting currents or the light-emitting voltages of the plurality of organic light-emitting diodes in the pixel unit group sensed by the sensing line; and S30: compensating the data signals applied to the plurality of pixel units in the pixel unit group respectively according to the compensation data.

For example, in the operation S10, at different periods of the gate line being selected, sensing the light-emitting currents or the light-emitting voltages of the plurality of organic light-emitting diodes in the pixel unit group corresponding to the gate line respectively by using the sensing line may comprise: in the light-emitting stage of the organic light-emitting diode, respectively controlling the third transistors in respective pixel units in the pixel unit group to be turned on sequentially by the sensing control lines, so as to sense the light-emitting currents or the light-emitting voltages of the plurality of organic light-emitting diodes in the pixel unit group by one sensing line.

For example, in the operation S20, generating the compensation data according to the light-emitting currents or the light-emitting voltages of the plurality of organic light-emitting diodes in the pixel unit group sensed by the sensing line may comprise: subtracting the preset light-emitting current or the preset light-emitting voltage form the light-emitting current or the light-emitting voltage sensed to obtain the compensation data. For example, the light-emitting voltage sensed by the sensing line is V1, and the preset light-emitting voltage of the pixel unit is V0, then the compensation data is VC=V1−V0. For example, the light-emitting current sensed by the sensing line is I1, and the preset light-emitting current of the pixel unit is I0, then a compensation current is IC=I1−I0. The compensation data VC is a compensation voltage corresponding to the compensation current IC, a relationship between the compensation data VC and the compensation current IC may be a functional relationship or a correspondence table established through experiments, so that from the functional relationship or the correspondence table, the compensation data VC can be restored based on the compensation current IC.

For example, in the operation S30, compensating the data signals applied to the plurality of pixel units in the pixel unit group respectively according to the compensation data may comprise: subtracting the compensation data VC from the initial data signal Vdata0 applied to the pixel unit to obtain the updated data signal Vdata, namely the updated data signal Vdata=Vdata0−VC.

For example, after obtaining the updated data signal Vdata, the data driver 11 may provide the updated data signal Vdata to the pixel unit corresponding to the updated data signal Vdata through the first data line or the second data line. In this way, the threshold voltage compensation and the channel mobility compensation of the first transistor in the pixel unit can be implemented, so as to improve the display accuracy.

A display panel, a display device and a compensation method provided by an embodiment of the present disclosure can increase the aperture ratio of the pixel unit through double-line scanning and sharing a sensing line, and can also provide more sufficient charging time for the pixel unit and accelerate the sensing speed.

Although detailed description(s) has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

The application claims priority to the Chinese patent application No. 201611090721.1, filed Dec. 1, 2016, the entire disclosure of which is incorporated herein by reference as part of the present application.

What is claimed is:

1. A display panel, comprising at least one pixel unit group, at least one sensing line, a plurality of gate lines, a plurality of first data lines, and a plurality of second data lines,
   wherein each pixel unit group comprises a plurality of pixel units arranged in two rows and a plurality of columns,
   the plurality of pixel units in each pixel unit group are connected to a same one of the gate lines to receive a same gate signal,
   one of two pixel units in each column of each pixel unit group is connected to one of the first data lines corresponding thereto, an other one of the two pixel units in each column of each pixel unit group is connected to one of the second data lines corresponding thereto,
   the plurality of pixel units in each pixel unit group are connected to a same sensing line,
   each of the pixel units comprises a light-emitting element, the sensing line is configured to sense a light-emitting current or a light-emitting voltage of the light-emitting element,
   a first data line of the plurality of first data lines and a second data line, which is adjacent to the first data line, of the plurality of second data lines are disposed between pixel units in adjacent two columns,
   no pixel unit is provided between the first data line and the second data line, which is adjacent to the first data line,
   a respective sensing line of the at least one sensing line is disposed between one of the plurality of first data lines and one of the plurality of second data lines adjacent thereto, no pixel unit is provided between the respective sensing line and the one of the plurality of first data lines, and no pixel unit is provided between the respective sensing line and the one of the plurality of second data lines, and
   pixel units, which are connected to the one of the plurality of first data lines, of the plurality of pixel units are located in even-numbered rows, and pixel units, which are connected to the one of the plurality of second data lines, of the plurality of pixel units are located in odd-numbered rows; or
   pixel units, which are connected to the one of the plurality of first data lines, of the plurality of pixel units are located in odd-numbered rows, and pixel units, which are connected to the one of the plurality of second data lines, of the plurality of pixel units are located in even-numbered rows,
   wherein the at least one pixel unit group comprises a plurality of pixel unit groups, in each pixel unit group of the plurality of pixel unit groups, a gate line of the plurality of gate lines is located between two rows of pixel units in each pixel unit group connected to the gate line,
   the plurality of pixel units in each of the plurality of pixel unit groups are connected to the same sensing line through connection lines,
   in each of the plurality of pixel unit groups, a connection line connected to a first row of the pixel units is located at a side of the first row of the pixel units away from a second row of the pixel units, and a connection line connected to the second row of the pixel units is located at a side of the second row of the pixel units away from the first row of the pixel units.

2. The display panel according to claim 1, wherein each of the pixel units further comprises:
   a drive circuit, configure to drive the light-emitting element to emit light during operation; and
   a sensing control circuit, configured to control the sensing line to sense the light-emitting current or the light-emitting voltage of the light-emitting element.

3. The display panel according to claim 2, wherein the drive circuit comprises a first transistor, a second transistor, and a storage capacitor,
   a first electrode of the first transistor is connected to a first power line to receive a first power voltage, a gate electrode of the first transistor is connected to a first node, and a second electrode of the first transistor is connected to a second node;
   a first electrode of the second transistor is configured to receive a data signal, a gate electrode of the second transistor is connected to one of the plurality of gate lines to receive a gate drive signal, and a second electrode of the second transistor is connected to the first node; and
   a first end of the storage capacitor is connected to the first node, and a second end of the storage capacitor is connected to the second node.

4. The display panel according to claim 3, further comprising a plurality of sensing control lines,
   wherein the sensing control circuit comprises a third transistor,
   a first electrode of the third transistor is connected to the second node, a gate electrode of the third transistor is connected to one of the sensing control lines to receive a sensing control signal, and a second electrode of the third transistor is connected to the sensing line.

5. The display panel according to claim 1, further comprising a first power line, configured to provide a first power voltage to the plurality of pixel units.

6. The display panel according to claim 1, further comprising:
   a data driver, configured to provide a data signal to the pixel units;
   a scan driver, configured to provide a gate drive signal to the pixel units; and
   a compensation controller, configured to generate compensation data according to the light-emitting current or the light-emitting voltage of the light-emitting element sensed by the sensing line and compensate the data signal with the compensation data.

7. The display panel according to claim 1, wherein each pixel unit group comprises the plurality of pixel units in two rows and two columns, the plurality of pixel units in two rows and three columns, or the plurality of pixel units in two rows and four columns.

8. The display panel according to claim 1, wherein the sensing line, the first data lines, and the second data lines extend in a same direction.

9. The display panel according to claim 1, wherein the sensing line is formed in a same layer as the first data lines and/or the second data lines.

10. The display panel according to claim 1, comprising a plurality of sensing lines,
    wherein the plurality of pixel unit groups are arranged in a matrix, and a plurality of pixel units of a plurality of pixel unit groups in each column are connected to a same one of the sensing lines.

11. The display panel according to claim 10, wherein each of a plurality of pixel units in a first row of each of the plurality of pixel unit groups is connected to the one of the first data lines corresponding thereto, and each of a plurality of pixel units in a second row of each of the plurality of pixel unit groups is connected to the one of the second data lines corresponding thereto.

12. A display device, comprising the display panel according to claim 1.

13. A compensation method for the display panel according to claim 1, comprising:
at different periods of a gate line being selected, sensing light-emitting currents or light-emitting voltages of light-emitting elements in the pixel unit group corresponding to the gate line respectively by using the sensing line.

14. The compensation method according to claim 13, further comprising:
generating compensation data according to the light-emitting currents or the light-emitting voltages of the light-emitting elements in the pixel unit group sensed by the sensing line, and using the compensation data to compensate data signals applied to the pixel units in the pixel unit group respectively.

15. The display panel according to claim 2, further comprising a first power line, configured to provide a first power voltage to the plurality of pixel units.

16. The display panel according to claim 2, further comprising:
a data driver, configured to provide a data signal to the pixel units;
a scan driver, configured to provide a gate drive signal to the pixel units; and
a compensation controller, configured to generate compensation data according to the light-emitting current or the light-emitting voltage of the light-emitting element sensed by the sensing line and compensate the data signal with the compensation data.

17. The display panel according to claim 2, wherein each pixel unit group comprises the plurality of pixel units in two rows and two columns, the plurality of pixel units in two rows and three columns, or the plurality of pixel units in two rows and four columns.

18. The display panel according to claim 1, wherein pixel units in a same column of a pixel unit group are connected to a corresponding first data line of the plurality of first data lines and a corresponding second data line, which is not directly adjacent to the corresponding first data line, of the plurality of second data lines, and the corresponding first data line and the corresponding second data line, which is not directly adjacent to the corresponding first data line, are located on two sides of the same column.

* * * * *